(12) United States Patent
Jain

(10) Patent No.: US 6,870,554 B2
(45) Date of Patent: Mar. 22, 2005

(54) MASKLESS LITHOGRAPHY WITH MULTIPLEXED SPATIAL LIGHT MODULATORS

(75) Inventor: Kanti Jain, Briarcliff Manor, NY (US)

(73) Assignee: Anvik Corporation, Hawthorne, NY (US)

( * ) Notice: Subject to any disclaimer, the term of this patent is extended or adjusted under 35 U.S.C. 154(b) by 282 days.

(21) Appl. No.: 10/337,713

(22) Filed: Jan. 7, 2003

(65) Prior Publication Data

US 2004/0130561 A1 Jul. 8, 2004

(51) Int. Cl.[7] .................................................. G09G 5/02
(52) U.S. Cl. ........................ 345/697; 708/816; 355/67
(58) Field of Search .............................. 345/694, 697; 708/816; 355/67

(56) References Cited

U.S. PATENT DOCUMENTS 6,238,852 B1 * 5/2001 Klosner ...................... 430/396
6,247,037 B1 * 6/2001 O'Callaghan ............... 708/816

* cited by examiner

Primary Examiner—Henry N. Tran
Assistant Examiner—Jean Lesperance
(74) Attorney, Agent, or Firm—Carl C. Kling

(57) ABSTRACT

Imaging systems that use a spatial light modulator (SLM), such as maskless lithography systems using a digital micromirror device (DMD), suffer from low throughput at high resolution because of the increase in the number of pixels to be imaged. A possible solution to this problem is provided by using multiple SLMs. However, packaging multiple SLMs on a suitable base is inefficient because, in an SLM, surrounding the active region, a large inactive region is required for the chip kerf and the connector fan-in; these inactive regions thus prevent close packing of the SLMs. This invention enables close packing of a large number of SLMs by arranging them in twin planes, such that the kerf and fan-in regions overlap substantially. Variations in the optical conjugate distances of different SLMs caused by the twin planarity are eliminated by incorporation of a twin-pane compensating mirror array that corresponds to the SLM array, and introduces a pathlength difference between different mirrors that is complementary to the pathlength difference between corresponding SLM chips. Depth-of-focus problems are thus eliminated. The invention enables significant throughput enhancement, up to 82%, in maskless lithography systems.

6 Claims, 2 Drawing Sheets

SLM Area = 1.68 cm²
Tot. Area = 3.6 cm²
Efficiency = 46.7%

SLM Area = 1.68 cm²
Effective Tot. Area = 2.71 cm²
Efficiency = 61.9%

MASKLESS LITHOGRAPHY WITH MULTIPLEXED SPATIAL LIGHT MODULATORS

FIELD OF THE INVENTION

The invention relates to an optical patterning system using multiple reflective spatial light modulator (RSLM) chips, and more particularly relates to a very high throughput, large-area maskless lithography system, using multiple RSLM chips mounted in plural planes with partial overlapping for closer RSLM chip packing and higher throughput, and using related auxiliary mirrors in complementary plural planes to compensate for pixel beamlet length variations from multi-planar RSLM chip placement.

DESCRIPTION OF RELATED ART

A variety of spatial light modulator (SLM) types, some transmissive and some reflective, are currently available. Preferred is a reflective SLM (RSLM) of the digital micromirror device (DMD chip) in which an array of micromirrors mounted in an x-y array of rows and columns can serve as individually selectable multiple beam devices. Each micromirror element has an x-y address selected by electrical signals to remain flat when unselected, or tilt when selected. A state-of-the-art DMD chip has an array of approximately 800×1000 micromirrors with associated addressing and other connections for pixel selection. Pixel selection can be accomplished very quickly and with good certainty, in a refresh time between light pulses applied to the DMD array on the chip. A micromirror element selected during such a refresh time serves to redirect its assigned pixel beamlet to a related selected pixel in the image plane for use.

A DMD chip with an array of 800×1000 pixels may have an active mirror array of 1.2×1.4 cm with 0.2 cm or wider borders. The border regions contain addressing electronics and allow a small space tolerance for dicing losses. In addition, such RSLM chips typically require an additional fan-in area, typically off-chip on a circuit board module, the module typically being more than three times the size of the RSLM chip in each dimension.

It is possible to mount a number of DMD chips, with associated fan-out boards, side-by-side on a suitable substrate, typically a polymer, silicon or glass wafer, to achieve a high-throughput, large-area imaging capability. While the active mirror portions of the DMD chips have very dense pixel packing, there are significant area losses due to kerf areas and fan-out boards. As already stated, the kerf areas are required for power, for addressing, and to permit chip dicing. The fan-in areas are required because of the very large number of addressing signals and power inputs required.

As an example, we calculate the packing efficiency of standard DMD chips with border regions, using a chip size of 1.2×1.4 cm and kerf regions of 3 mm width.

Area of active mirror array=1.2×1.4=1.68 cm$^2$

Kerf region width=0.3 cm

Area of total array package=1.8×2.0=3.60 cm$^2$

→Packing efficiency=1.68/3.60=46.7%

The above packing efficiency is further harmed when the fan-in area of the connector module is taken into account. As an example, if we take a fan-in module size of 3.0 cm×2.8 cm=8.4 cm$^2$, it will reduce this 46.7% packing efficiency to 1.68/8.4=20%.

Packing efficiency might be incremented somewhat by use of a larger DMD chip. Addressing realities, however, might require that the larger chip have a wider kerf to accommodate the greater addressing requirements. In any case, changes by the DMD manufacturer might be uneconomical just to increase the packing efficiency marginally. The favored choice is to use standard DMD chips where possible.

BRIEF SUMMARY OF THE INVENTION

The invention is a maskless lithography system using SLMs, such as DMD chips, mounted in close-packed twin-plane multiplex subassemblies, with partial overlap of DMD chips, and with focus-compensation related to the multiplanarity. The partial-overlap technique permits closer packing of DMD chips by overlapping the inactive kerf areas while leaving active mirror areas undisturbed, to reflect incident radiation. The partial-overlap technique adds approximately 15% to the packing density and 33% to the lithography system throughput. This enhancement becomes significantly greater when the fan-in regions for the connectors are taken into consideration. For example, for a module size of 3.0 cm×2.8 cm=8.4 cm$^2$ and the DMD size same as before (1.4 cm×1.2 cm=1.68 cm$^2$), the packing efficiency becomes 1.68/8.4=20.0%. With the twin-plane packing technique of this invention, this efficiency increases to 36.4%, giving a throughput increase of 36.4/20.0=1.82=82%. The partial-overlap technique, however, places half the DMD chips in a base plane and the other half of the DMD chips in an alternate plane, with the base plane and the alternate plane being parallel but spaced apart by the thickness T of the DMD elements plus tolerances (T+t). This spacing (T+t) would, without compensation, cause there to be two different pixel beamlet lengths which would overwhelm the required depth of focus requirements of the system. This invention provides such compensation, appropriate in positioning and spacing, so as to maintain a fixed pixel beamlet length for each of the myriad pixel beamlets.

The object of the invention is to provide a means for performing maskless lithography by multiplexing an array of n separate DMD chips, each with multiple thousands (m) of individually-addressable pixel-selection mirrors, to provide via a reducing production lens an in-focus highly-reduced patterning image at the substrate of (n×m) pixel beams. Focus lost by the multi-plane positioning of partially-overlapped DMD chips is regained by using a twin-plane set of mirrors with complementary multi-plane positioning. Each partially-overlapped DMD chip sends data-selected pixel beamlets to a complementary twin-plane set of mirrors, each mirror matching a related DMD chip in x-y size and position while being positioned complementarily in z depth. The individual mirror compensates for pixel-beamlet-length at the input to the projection lens.

A feature of the invention is that the pixel-selection capability of multiple DMD arrays per unit area is enhanced by approximately 15%, without altering the apparent pixel-beamlet-length, because the compensating mirrors maintain focus within depth-of-focus tolerances during pixel selection.

An advantage of the invention is that it is modular, and can be incorporated into a patterning system using a variety of configurations of DMDs or other SLMs.

Another advantage of the invention is that the focal length of the pixel-beams can vary by a large amount (as much as 5 mm) without adversely affecting the much more precise focus requirements at the image plane of the reducing projection lens and the surface of the substrate.

Still another advantage, a major enhancement in throughput, occurs when the overlapping is done at the fan-in circuit board level, in which situation a simple twin-plane overlap may results in a throughput enhancement as large as 82%.

Other objects, features and advantages of the invention will be apparent to those skilled in the art, with reference to the written description and drawings.

DRAWINGS

DETAILED DESCRIPTION OF THE INVENTION

Figure 1:
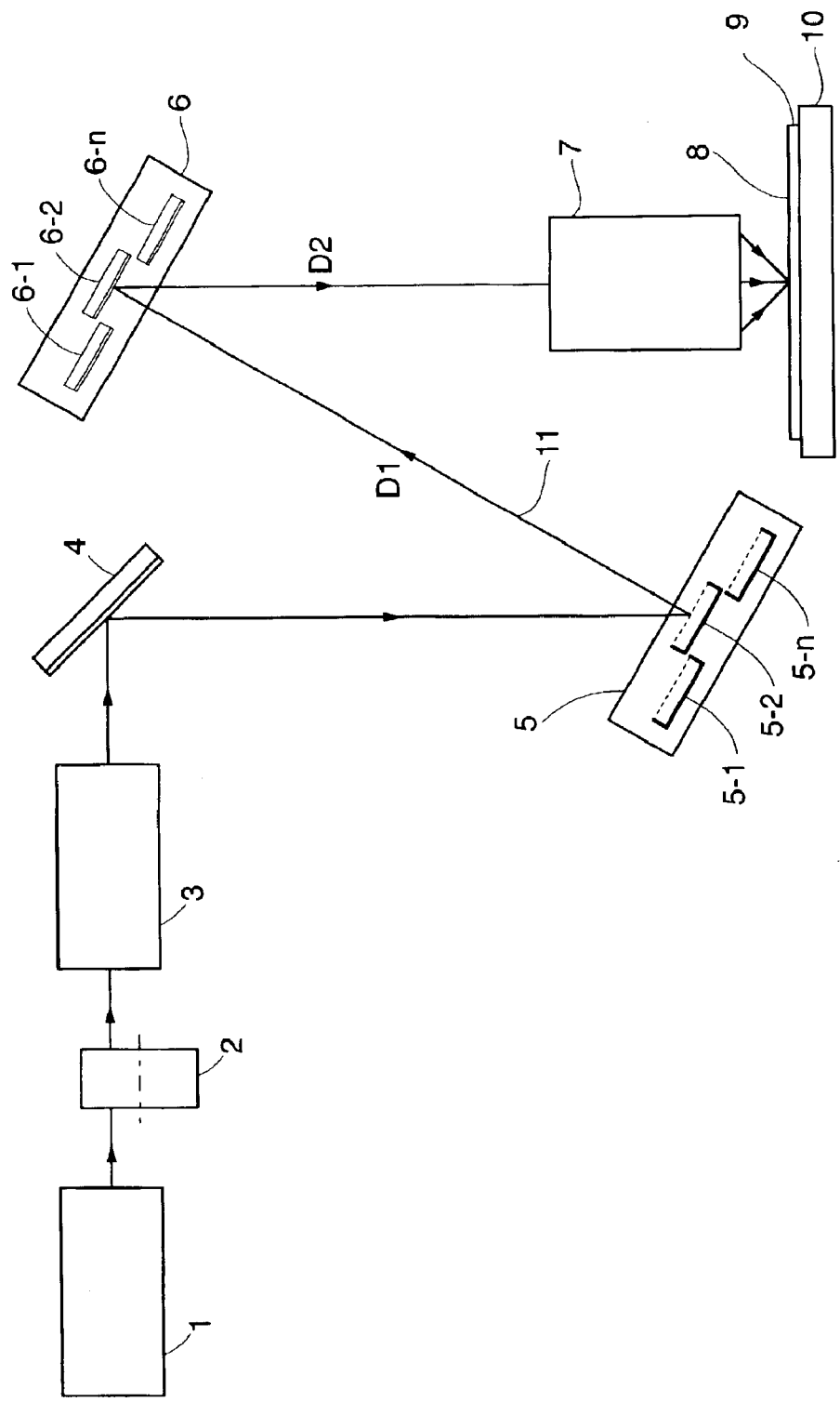
FIG. 1 is a partially schematic elevation view of a multiplexed-SLM maskless lithography system according to the invention.

The multiplexed-SLM maskless lithography system is shown in FIG. 1. Light source 1, which may preferably be a pulsed excimer laser or a continuous-wave (CW) light source, such as a lamp or a gas laser, chopped by a pulser 2, provides illumination pulses. The pulser 2 may be a mechanical chopper or an optical shutter or an electro-optical modulator. The pulses are required in order to provide illumination synchronization with the pixel data. The pulses also provide blanking during the refresh portion of the cycle, during which various required scanning motions may be provided and during which the micromirror selection may be changed. The next system element is a beam conditioner 3, which preferably is a recycling homogenizer, to efficiently uniformize the full beam area. Steering mirror 4 redirects the full beam to the multiplexed SLM subsystem 5, which preferably is a twin-plane package of slightly-overlapped DMD arrays 5-1, 5-2 . . . 5-n. Each DMD array has some 800,000 micromirrors, one for each pixel-beam, in a central pixel-mirror area, and includes addressing signal and power conductors in a surrounding kerf area. Pixel-mirror areas and surrounding kerf areas of such DMD arrays are not shown in FIG. 1, but are important and will be shown in and discussed with FIGS. 2–4.

Selected pixel beams are redirected by individual micromirrors of the multiplexed twin-plane SLM package respectively to mirrors 6-1, 6-2 . . . 6-n of multiplexed twin-plane packaging compensator 6. The mirrors of the multiplexed twin-plane packaging compensator 6 redirect the selected individual pixel beams to the entry plane of reducing projection lens 7 for focusing at the surface 8 of substrate 9 mounted on scanning stage 10.

A critical focusing distance (Df) is the total beamlet travel distance from the surface of the selected DMD micromirror to the entry plane of the projection lens 7. For example, a selected pixel-beamlet 11, incident on the selected DMD micromirror 5-2, travels a first measurable distance (D1) from its selecting DMD micromirror 5-2 to the related complementarily compensating array mirror 6-2. This selected beamlet is reflected by the mirror 6-2, traveling a second measurable distance (D2) to the entry plane of projection lens 7. The critical focusing distance is then Df=D1+D2. This critical distance Df is maintained constant in the preferred embodiment for each pixel beamlet. The projection lens 7 is a reducing lens (preferably 100:1). Such a reducing lens can accept a very large pixel beamlet length tolerance, of as much as 5 mm, at its entry plane and still meet depth-of-focus requirements of approximately 0.5 $\mu$m at its image plane at the substrate surface.

Figure 2:
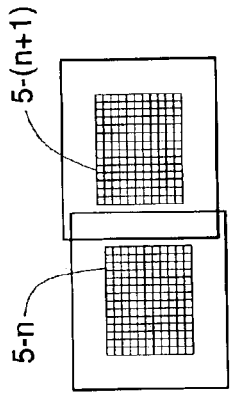
FIG. 2 is a simplified plan view of a typical DMD chip, with a table of active and kerf areas, and utilization efficiency.

FIG. 2 is a plan view of a typical DMD chip 5-n, showing micromirror array area 12 and kerf area 13. Typical dimensions are shown in centimeters, although such dimensions are not mandatory. There will be an x-y array of individual DMD micromirrors, with selected micromirror 14 identified as one of the approximately 800,000 micromirrors present on the single DMD chip. The total area of the DMD chip including the kerf is 3.6 cm$^2$. Note that the active area is 1.68 cm$^2$, while the kerf area is 3.6−1.68=1.92 cm$^2$. The packaging efficiency of active micromirrors/addressing-kerf is 46.7%. The packing efficiency is further reduced when the fan-in regions for the DMD chip connectors are taken into consideration. For example, if the fan-in connector region is 5 mm wide, then, for a overall module size of 3.0 cm×2.8 cm=8.4 cm$^2$, the packing efficiency becomes 1.68/8.4= 20.0%.

Figure 3:
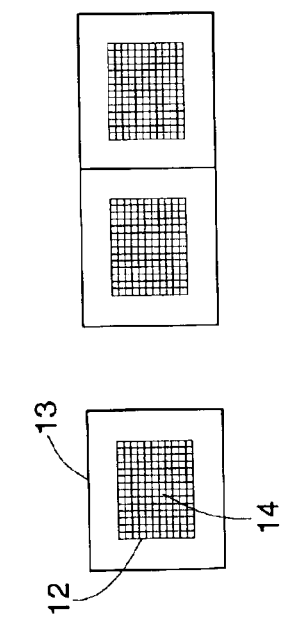
FIG. 3 is a simplified plan view showing DMD chip overlap of two typical DMD chips, with a table of areas and efficiency.

FIG. 3 shows the overlapping of DMD chips in the preferred embodiment of the invention. The active area of the DMD chip 5-n remains constant, as does the kerf area. The difference, however, is that a second DMD chip 5(n+1) is mounted for partial overlap of the first DMD chip 5-n. This partial overlap, even with 0.5 cm left for assembly tolerance, increases the efficiency of the DMD packing density to 61.9%, which results in a lithography system throughput enhancement of 33%. If we consider a DMD chip with the fan-in region, then with the twin-plane packing technique of this invention, the packing efficiency increases from 20.0% to 36.4%, giving a throughput increase of 36.4/20.0=1.82=82%.

Note that these efficiency percentages do not consider the DMD arrays at the edges of the beam area. The total efficiency percentages, and resulting throughput enhancement, will vary slightly, depending on the number of DMD chips present.

Figure 4:
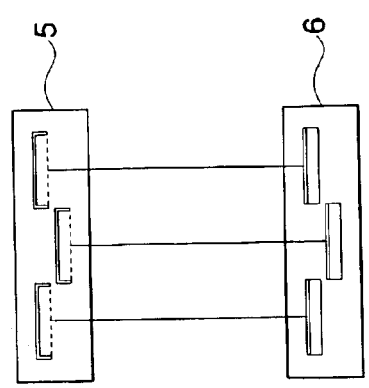
FIG. 4 is a composite view of DMD chip placement in a twin-plane configuration, with complementary mirror placement in a twin-plane configuration.

FIG. 4 presents an edge-on stylized view of a number of DMD chips 5-1, 5-2, 5-3 . . . 5-n mounted in the multiplexing package 5 of the preferred embodiment of FIG. 1, showing the twin-plane mounting and the overlap. FIG. 4 also shows the twin-plane complementary mirror package 6, with mirrors 6-1, 6-2, 6-3 . . . 6-n juxtaposed. FIG. 4 shows the packages 5 and 6 as if directly juxtaposed, rather than in the required slightly offset juxtaposition shown in FIG. 1, merely for ease in discussing the beamlet length effects of the complementary twin-plane packages. The FIG. 1 showing of beamlet redirecting into the projection lens 7 is appropriate.

Figure 5:
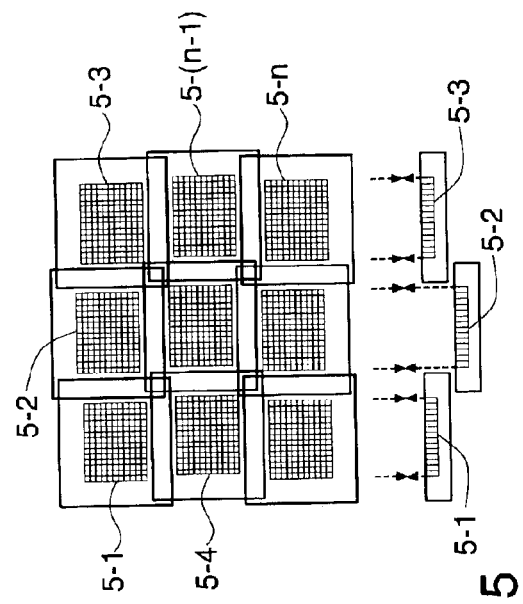
FIG. 5 is a partial showing of alternating overlapping DMD chip placement.

FIG. 5 shows in plan view how the DMD chips are mounted for efficiency enhancement. Chips 5-1, 5-3 and 5-n are in a first plane. Chip positions 5-2, 5-4 and 5-(n−1) are in a second plane. Mirrors 6-1, 6-3 and 6-n are in a second plane; mirrors 6-2, 6-4 and 6-(n−1) are in a first plane. The total beamlet lengths are compensated by the complementary planar locations of the DMD chips and the compensating mirrors.

Note that the DMD chip twin-plane package 5 may be, and is preferred to be, assembled separately from the mirror twin-plane package 6, using different substrates and different production techniques. Therefore, the DMD chip package and the DMD chip compensator package are the subjects of separate claims and also as mutually cooperating and compensating elements in the system claims.

While the invention has been shown and described with respect to a preferred embodiment, it will be apparent to those familiar with the art to make appropriate changes in form and detail, while remaining within the spirit and scope of the invention as claimed.

I claim:

1. An imaging system for providing selected myriad-pixel patterns on substrate surfaces requiring high-resolution exposure to light within limited depth-of-focus tolerance, using a plurality of reflective spatial light modulator (RSLM) chips each having an active micromodulator array area for beam transfer and a kerf area usable for addressing individual micromodulators characterized by:

a) a light source (1–4) of a conditioned pulsed light beam of significant area;

b) a plural-plane multiplexed reflective spatial light modulator (RSLM) package (5) having a plurality of RSLM myriad-pixel chips (5-1 . . . 5-n) mounted with partial overlap in an alternating-plane pattern presenting a plurality of planar micromodulator pixel mirror surfaces including at least first and second pixel micromodulator planes;

c) means for mounting said plural-plane multiplexed reflective spatial light modulator package (5) to receive the conditioned pulsed light beam from said light source (1–4) and provide selected pixel beamlets as selected by the system;

d) a plural-plane compensator mirror package (6), having mirror areas (6-1 . . . 6-n) mounted in an alternating-plane pattern presenting a plurality of planar mirror surfaces including at least first and second mirror planes complementary to said first and second pixel micromodulator planes of said multiplexed reflective spatial light modulator package (5);

e) projection scanning means (7–11) for presenting a substrate for imaging according to beamlet selection; and f) means for mounting said plural-plane multiplexed mirror package (6) to forward the selected conditioned pulsed light beamlets from said multiplex spatial light modulator package (5) via said projection scanning means (7–11) for imaging said substrate according to beamlet selection;

whereby the individual pixel beamlets from all micromodulator chips in the multiplexed RSLM package are maintained within near-constant beamlet lengths to maintain depth-of-focus tolerance at the entry plane of said projection scanning means, and whereby the micromodulator chips in the multiplexed reflective SLM package are efficiently utilized for imaging to provide enhanced-throughput patterning of said substrate.

2. An imaging system according to claim 1, wherein said RSLM package comprises chips of digital micromirror devices (DMDs).

3. An imaging system according to claim 1, wherein said RSLM package comprises chips of reflective liquid crystal devices.

4. An imaging system according to claim 2, wherein said plural-plane multiplexed DMD chip package (5) and said plural-plane multiplexed compensating mirror package (6) have reflecting surfaces in two parallel planes each.

5. An RSLM package array for use in large-area imaging, with RSLM chip packages having micromodulator areas and surrounding kerf areas on-chip, and also having associated surrounding off-chip fan-in circuit-board areas, characterized by:

a) a base;

b) a first plurality of RSLM packages mounted with selected spacing at a first level on said base; and c) a second plurality of RSLM packages mounted on said base at a higher level, with vertical spacing and horizontal spacing for substantial overlap of kerf areas and fan-in areas but without micromodulator area overlap.

6. An RSLM package mirror compensator package for use in imaging in which RSLM chips are in plural planes having micromodulator areas and substantially overlapping surrounding areas, creating variations in micromodulator pixel beamlet lengths characterized by:

a) a base;

b) a first plurality of mirrors mounted with selected spacing at a first level on said base; and c) a second plurality of mirrors mounted on said base at a higher level on said base, said mirrors having vertical spacing and horizontal spacing appropriate for complementing the pixel beamlet length variations caused by different micromodulator chips of the RSLM package.

* * * * *